US012586984B2

(12) United States Patent
Davenport

(10) Patent No.: US 12,586,984 B2
(45) Date of Patent: Mar. 24, 2026

(54) APPARATUS COMPRISING A DISTRIBUTED COUPLED-CAVITY WAVEGUIDE REFLECTOR

(71) Applicant: Quintessent Inc., Goleta, CA (US)

(72) Inventor: Michael Davenport, Santa Barbara, CA (US)

(73) Assignee: Quintessent Inc., Goleta, CA (US)

( * ) Notice: Subject to any disclaimer, the term of this patent is extended or adjusted under 35 U.S.C. 154(b) by 884 days.

(21) Appl. No.: 17/881,258

(22) Filed: Aug. 4, 2022

(65) Prior Publication Data

US 2023/0048527 A1  Feb. 16, 2023

Related U.S. Application Data

(60) Provisional application No. 63/231,648, filed on Aug. 10, 2021.

(51) Int. Cl.
| | |
|---|---|
| *H01S 3/10* | (2006.01) |
| *H01S 5/026* | (2006.01) |
| *H01S 5/10* | (2021.01) |
| *H01S 5/125* | (2006.01) |
| *H01S 5/14* | (2006.01) |

(52) U.S. Cl.
CPC ............ *H01S 5/1028* (2013.01); *H01S 5/026* (2013.01); *H01S 5/125* (2013.01); *H01S 5/141* (2013.01)

(58) Field of Classification Search
CPC ........ H01S 5/1028; H01S 5/026; H01S 5/125; H01S 5/141; H01S 5/021; H01S 5/0215; H01S 5/2031; H01S 5/124; H01S 5/3213; H01S 5/0287
See application file for complete search history.

(56) References Cited

U.S. PATENT DOCUMENTS

| | | | | |
|---|---|---|---|---|
| 4,550,410 A | * | 10/1985 | Chenausky ............. | H01S 3/082 372/99 |
| 2003/0039024 A1 | * | 2/2003 | Clayton ............... | H04B 10/299 359/326 |
| 2013/0100977 A1 | * | 4/2013 | Smeeton ................. | G02F 1/377 427/160 |

(Continued)

OTHER PUBLICATIONS

C. Herbert et al., "Discrete Mode Lasers for Communications", "IET Optoelectronics", Mar. 1, 2009, the Institution of Engineering and Technology, doi:10.1049/iet-opt:20080028, 18 pp., vol. 3, Iss. 1.

(Continued)

*Primary Examiner* — Kinam Park
(74) *Attorney, Agent, or Firm* — Kaplan Breyer Schwarz LLP

(57) ABSTRACT

Coupled-cavity waveguide reflectors suitable for use in high-Q reflective spectral filters, narrow-linewidth lasers, and the like, are presented. Coupled-cavity waveguide reflectors in accordance with the present disclosure comprise multiple waveguide segments arranged in a series, each segment including a tooth having relatively higher refractive index and a gap having relatively lower refractive index, where the lengths of the teeth and gaps are based on the position of their respective segments in the series. The lengths of the teeth and gaps are selected such that the reflectivity of the segments align at only a single wavelength, thereby enabling very narrow-linewidth operation.

36 Claims, 10 Drawing Sheets

(56) References Cited

U.S. PATENT DOCUMENTS

2022/0216669 A1* 7/2022 Menezo ................. H01S 5/021

OTHER PUBLICATIONS

Simon Osborne et al., "Design of Single-Mode and Two-Color Fabry-Perot Lasers With Patterned Refractive Index", "IEEE Journal of Selected Topics in Quantum Electronics", Oct. 1, 2007, Doi: 10.1109/JSTQE.2007.903851, 8 pp., vol. 13, No. 5.

Stephen O'Brien et al., "Spectral manipulation in Fabry-Perot lasers: perturbative inverse scattering approach", Jan. 10, 2006, Optical Society of America, pp. 1046-1056, vol. 23, No. 6.

* cited by examiner

100 view through line b-b view through line c-c view along axis A1

300

Provide active layer 204 — 301

Form RS layer 306 — 302

Define DCC reflector 212 — 303

Form upper cladding 208 — 304

Form mirrors 210A and 210B — 305

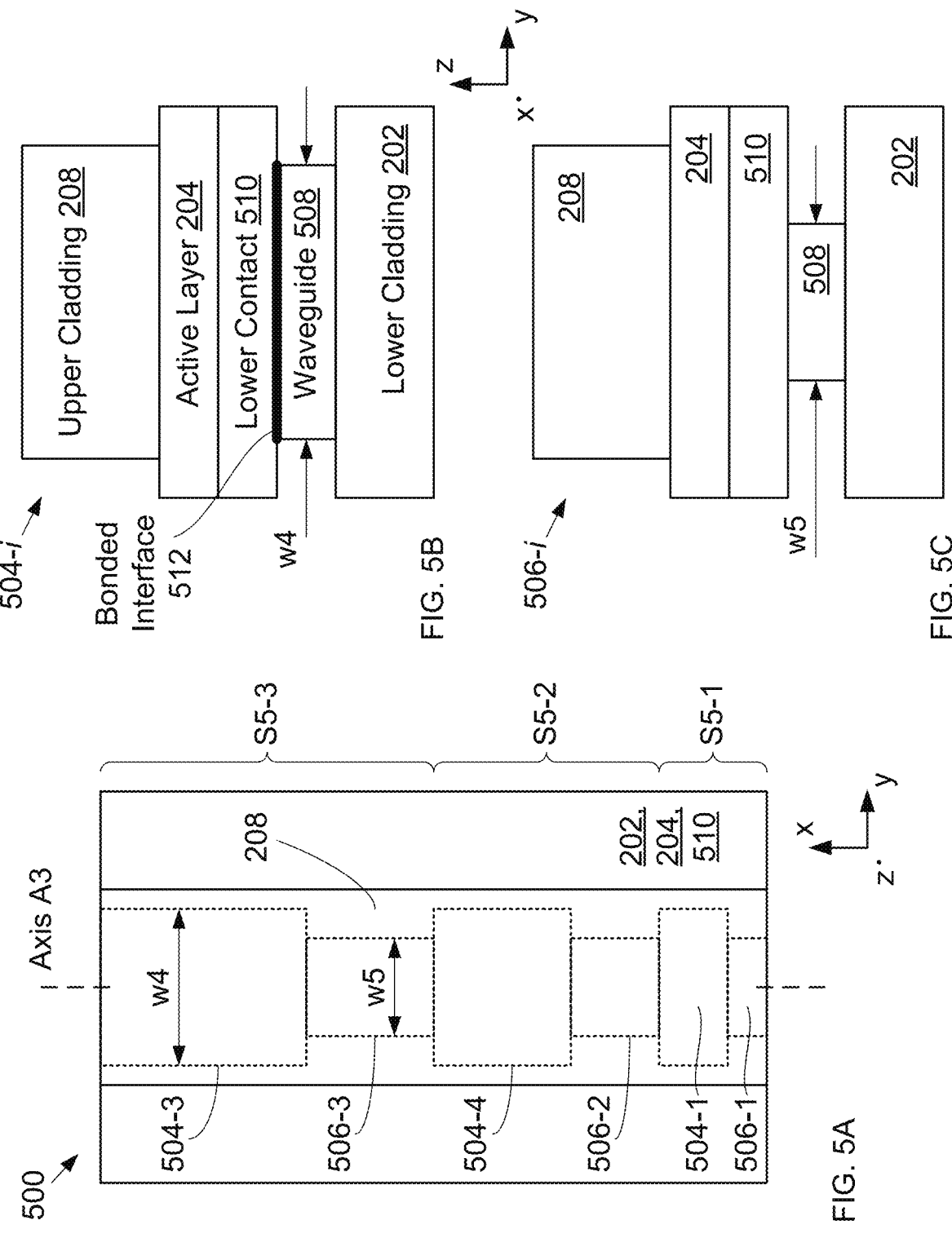

APPARATUS COMPRISING A DISTRIBUTED COUPLED-CAVITY WAVEGUIDE REFLECTOR

CROSS REFERENCE TO RELATED APPLICATIONS

This case claims the benefit of U.S. Provisional Patent Application Ser. No. 63/231,648 filed Aug. 10, 2021, which is incorporated by reference as if set forth at length herein.

TECHNICAL FIELD

The present disclosure relates to photonic devices in general, and, more particularly, to narrow-linewidth waveguide reflectors and lasers that incorporate them.

BACKGROUND

Distributed feedback (DFB) lasers and Distributed Bragg Reflector (DBR) lasers provide very narrow-linewidth output signals having very high wavelength stability. As a result, DFB and DBR lasers are attractive for use in many applications, such as telecommunications and data communications systems.

To realize spectral stability, the laser cavity of a DFB or DBR laser includes at least one reflector defined by a grating structure comprising a periodic variation of refractive index along the longitudinal direction of the laser. The desired spectral stability arises from the fact that a diffraction-grating-based mirror reflects a narrower band of wavelengths than a conventional mirror, thereby limiting the number of standing waves that can be supported in the laser cavity.

Unfortunately, the periodic features of a typical grating structure suitable for the purpose are difficult to fabricate due to their extremely small size. In fact, the use of E-beam lithography is normally required. In addition, once the grating elements have been formed, a cladding layer must be formed over them via a regrowth process. Since both E-beam lithography and regrowth are time-consuming and expensive processes, their use tends to make the cost of DFB and DBR lasers quite high. As a result, they can be unattractive for many applications.

To mitigate some of the problems inherent to DFB and DBR lasers, the Discrete-Mode (DM) laser was developed. The DM laser includes quarter-wavelength long slots etched into the surface of a Fabry-Perot cavity such that the facets are reflective. The slots are arrayed to give rise to a single longitudinal mode for the laser.

Unfortunately, DM lasers have two major disadvantages. First, the quarter-wavelength slots are extremely small (typically less than 100 nm); therefore, they are difficult to lithographically define and fabricate. Second, the mode-selection mechanism still requires the cleaved facet of the Fabry-Perot laser, resulting in an inherent yield problem due to the random phase of the final section before the cleave.

An ability to cost-effectively realize a laser that generates a stable, narrow-linewidth output signal would represent a significant advance in the state of the art.

SUMMARY

The present disclosure is directed toward surface-waveguide-based distributed coupled-cavity (DCC) reflectors suitable for use in high-Q reflective spectral filters, narrow-linewidth lasers, and the like. DCC reflectors in accordance with the present disclosure are suitable for use in a wide range of applications, including free-space optics sources, guided-wave optics, planar-lightwave circuits (PLC), photonic integrated circuits (PIC) and the like. Lasers in accordance with the present disclosure are suitable for replacing a DFB or DBR laser—particularly, in applications that require high output power.

An advance over the prior art is made by enabling fabrication of a narrow-linewidth DCC reflector that is operatively coupled with an integrated-optics waveguide, where the DCC reflector is designed in such a way that E-beam lithography is unnecessary for its fabrication. Furthermore, some embodiments in accordance with the present disclosure do not require regrowth after definition of the DCC reflector. DCC reflectors in accordance with the present disclosure comprise multiple waveguide segments arranged in a series, each segment including a tooth having relatively higher refractive index and a gap having relatively lower refractive index such that the series of segments defines a variation of effective-refractive-index along the longitudinal direction of the series of segments. The teeth and gaps are dimensioned such that the reflectivity of the segments align at only a single wavelength, thereby enabling very narrow-linewidth operation. In some embodiments, the length of each tooth and gap is based on the position of its respective segment in the series. DCC reflectors in accordance with the present disclosure are particularly well suited for use in a laser cavity of a diode laser and can eliminate the need for a cleaved facet-mirror for a cavity, thereby enabling higher fabrication yield, lower cost, and easier integration of lasers with other elements in a photonic integrated circuit.

An illustrative embodiment of the present disclosure is a DCC reflector that defines one mirror of a gain section of a DCC laser. The gain section is located between the DCC reflector and a cleaved facet that defines its other mirror. The DCC laser structure includes a layer stack that includes upper and lower claddings that surround a pair of layers that includes a RS layer disposed on an active layer. The DCC reflector includes a series of one hundred segments, where each segment includes a gap in which the material of the RS layer has been removed to reduce its effective refractive index from its as-deposited refractive index, and a tooth in which the RS layer is intact and, thus, is characterized by the as-deposited refractive index of the reflective-segment-layer material. The lengths of the gaps and teeth vary along the series of segments according to the position of their respective segments along the longitudinal direction of the laser.

The plurality of segments gives rise to a plurality of cavity portions whose cavity lengths are in phase at only a single wavelength. As a result, single-wavelength lasing is realized without the need to phase tune one or more of the cavity portions.

In some embodiments, the longitudinal variation of effective refractive index is induced via another of a wide range of suitable approaches, such as fins etched into the sidewall of at least one layer of a waveguide or laser structure, slots formed in at least one layer in a waveguide or laser structure, slots formed in a buried layer operatively coupled with a waveguide or laser structure, features located adjacent to a waveguide or the laser cavity of a laser, and the like.

In some embodiments, a laser structure does not include the RS layer.

In some embodiments, the laser structure includes a waveguide that is located between the upper and lower claddings. In some of these embodiments, features are defined in the waveguide layer to form gaps whose width and depth determine the grating strength.

An embodiment in accordance with the present disclosure is an article comprising: a substrate; and a first distributed coupled-cavity (DCC) reflector disposed on the substrate, the first DCC reflector having a first longitudinal axis and being reflective at a first wavelength, wherein the first DCC reflector includes: a first plurality of teeth, wherein the teeth of the first plurality thereof have different lengths along the first longitudinal axis, and wherein each tooth of the first plurality thereof has a first length that is based on its location along the first longitudinal axis; and a first plurality of gaps, wherein the gaps of the first plurality thereof have different lengths along the first longitudinal axis, and wherein each gap of the first plurality thereof has a second length that is based on its location along the first longitudinal axis; wherein the of teeth of the first plurality thereof and the gaps of the first plurality thereof are interleaved and collectively define a first plurality of cavities, each cavity of the first plurality thereof having a reflection peak at the first wavelength.

Another embodiment in accordance with the present disclosure is an article comprising a first distributed coupled-cavity (DCC) reflector disposed on a substrate, the first DCC reflector having a first longitudinal axis and being reflective at a first wavelength, $\lambda_0$, wherein the first DCC reflector includes a first plurality of segments, the first plurality of segments including M segments that are arranged contiguously along the first longitudinal axis, and wherein each $m^{th}$ segment, where m=1 through M, includes: a first tooth having a first length, $L_{1,m}$, along the first longitudinal axis, wherein $L_{1,m}=(\lambda_0/4n_1+b)(4m+1)$; and a first gap having a second length, $L_{2,m}$, along the first longitudinal axis, wherein $L_{2,m}=(\lambda_0/4n_2-b)(4m+3)$; wherein $n_1$ is the effective refractive index of the first tooth, $n_2$ is the effective refractive index of the first gap, and b is a section-detuning value for giving rise to a phase error that accumulates as a multiple of $\pi/4$; wherein the first plurality of segments defines a first plurality of cavities, each cavity of the first plurality thereof having a reflection peak at the first wavelength.

Yet another embodiment in accordance with the present disclosure is a method comprising: providing a first substrate; and forming a first distributed coupled-cavity (DCC) reflector on the first substrate, the first DCC reflector being formed such that it has a first longitudinal axis, is reflective at a first wavelength, and includes: a first plurality of teeth, wherein the teeth of the first plurality thereof have different lengths along the first longitudinal axis, and wherein each tooth of the first plurality thereof has a first length that is based on its location along the first longitudinal axis; and a first plurality of gaps, wherein the gaps of the first plurality thereof have different lengths along the first longitudinal axis, and wherein each gap of the first plurality thereof has a second length that is based on its location along the first longitudinal axis; wherein the of teeth of the first plurality thereof and the gaps of the first plurality thereof are interleaved and collectively define a first plurality of cavities, each cavity of the first plurality thereof having a reflection peak at the first wavelength.

4

Figures 2A, 2B, 2C, 2D:
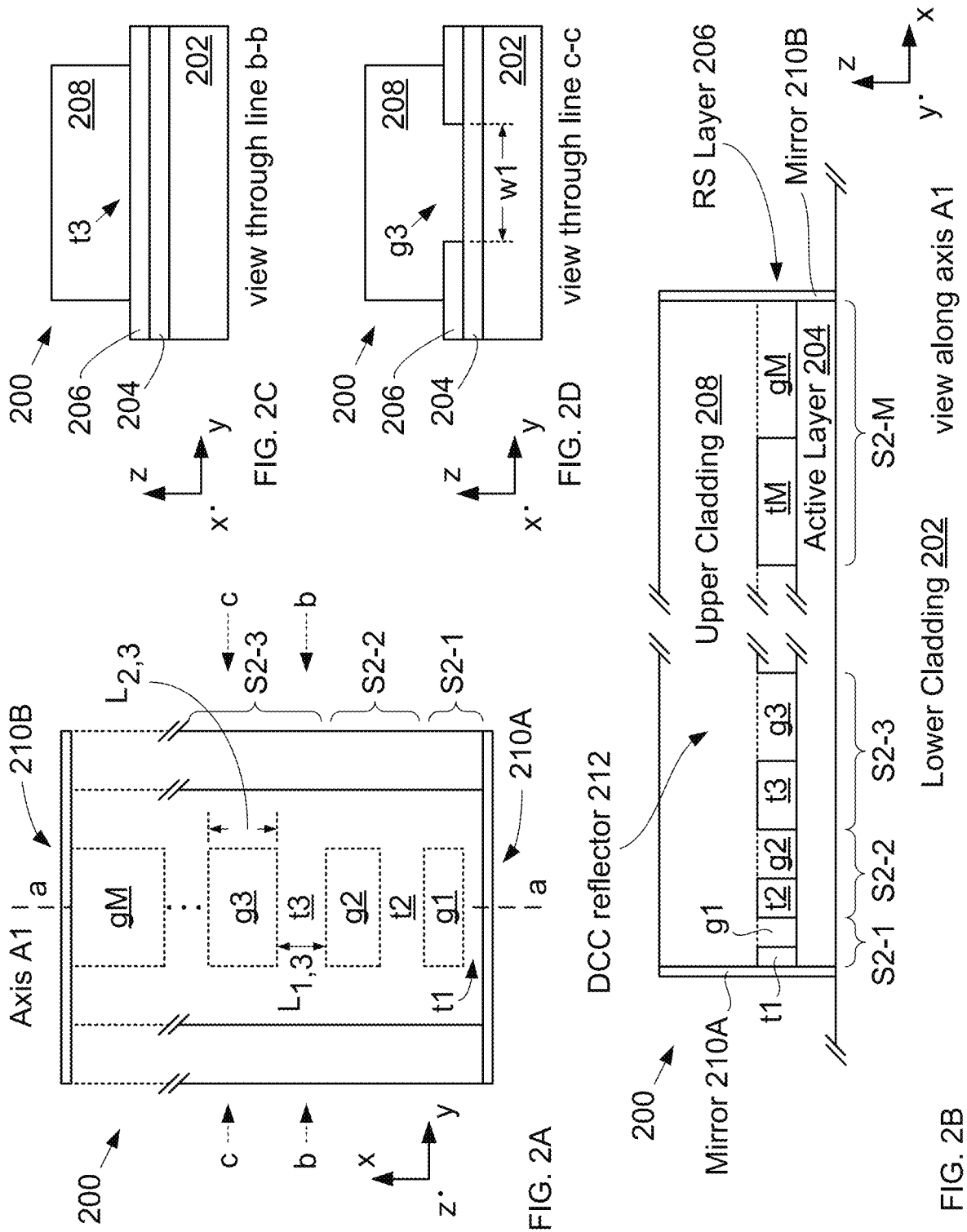
FIG. 2A depicts a plan view of an illustrative embodiment of a DCC laser in accordance with the present disclosure.

FIGS. 2B-D depict cross-sectional views taken through different points of laser 200.

Figure 3:
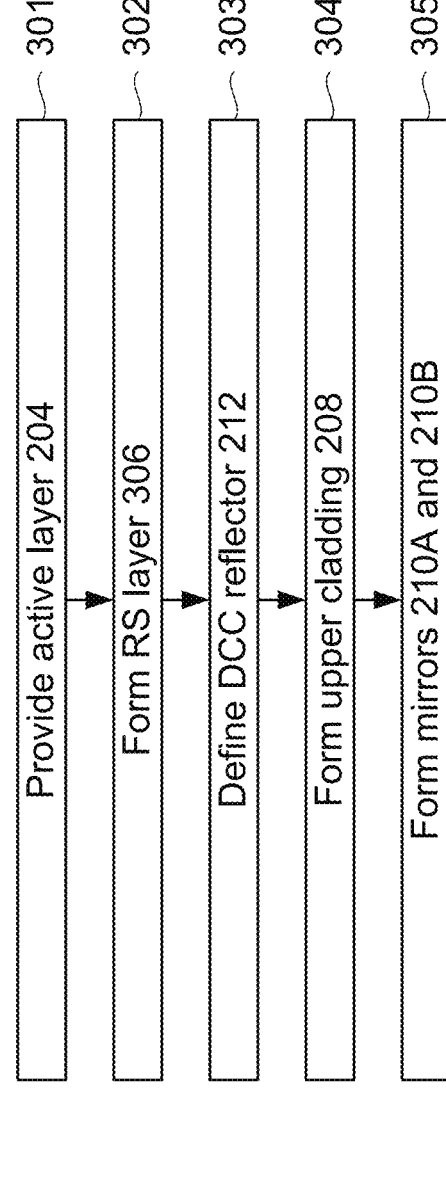

FIG. 3 depicts operations of an exemplary method suitable for forming a DCC laser in accordance with the present disclosure.

Figures 4A, 4B, 4C:
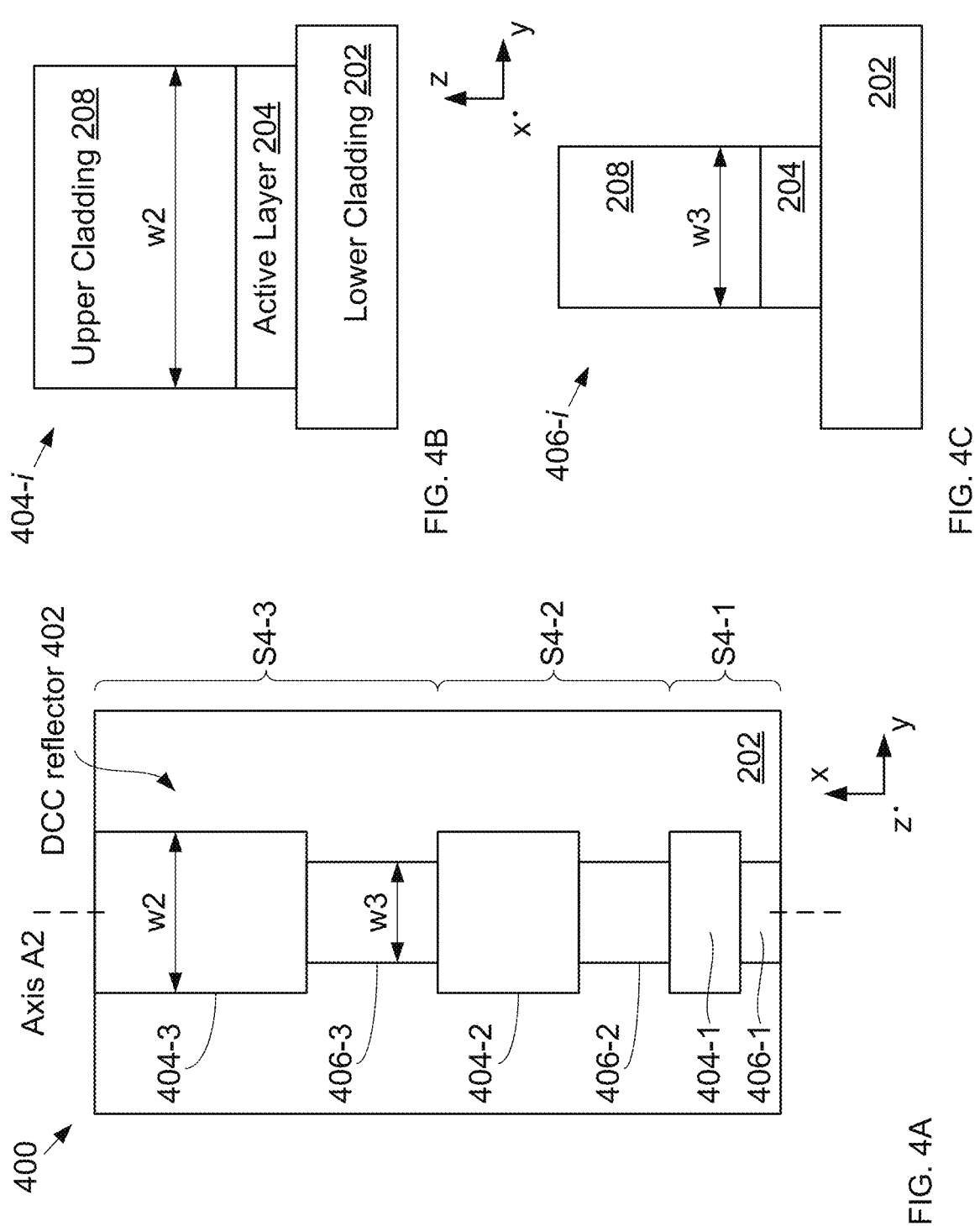

FIGS. 4A-C depict schematic drawings of plan and cross-sectional views of DCC laser comprising a first alternative embodiment of a DCC reflector in accordance with the present disclosure.

FIG. 5A depicts a schematic drawing of plan view of a portion of a second alternative DCC laser in accordance with the present disclosure.

FIGS. 5B-C depict schematic drawings of cross-sectional views of a representative tooth and gap, respectively, of DCC laser 500.

Figures 6A, 6B:
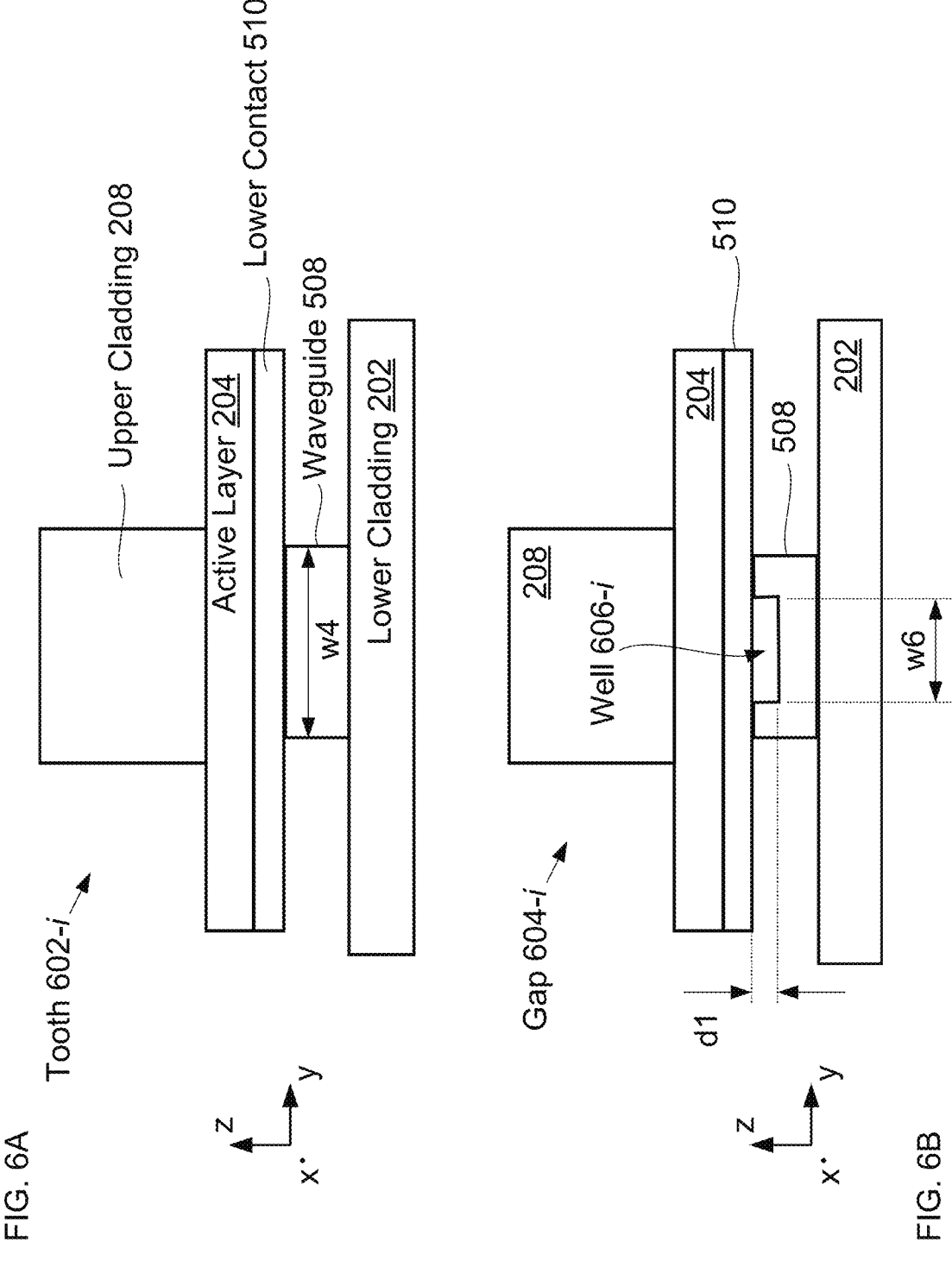

FIGS. 6A-B depict schematic drawings of cross-sectional views of a representative tooth and gap, respectively, of DCC laser 600.

Figures 7A, 7B:
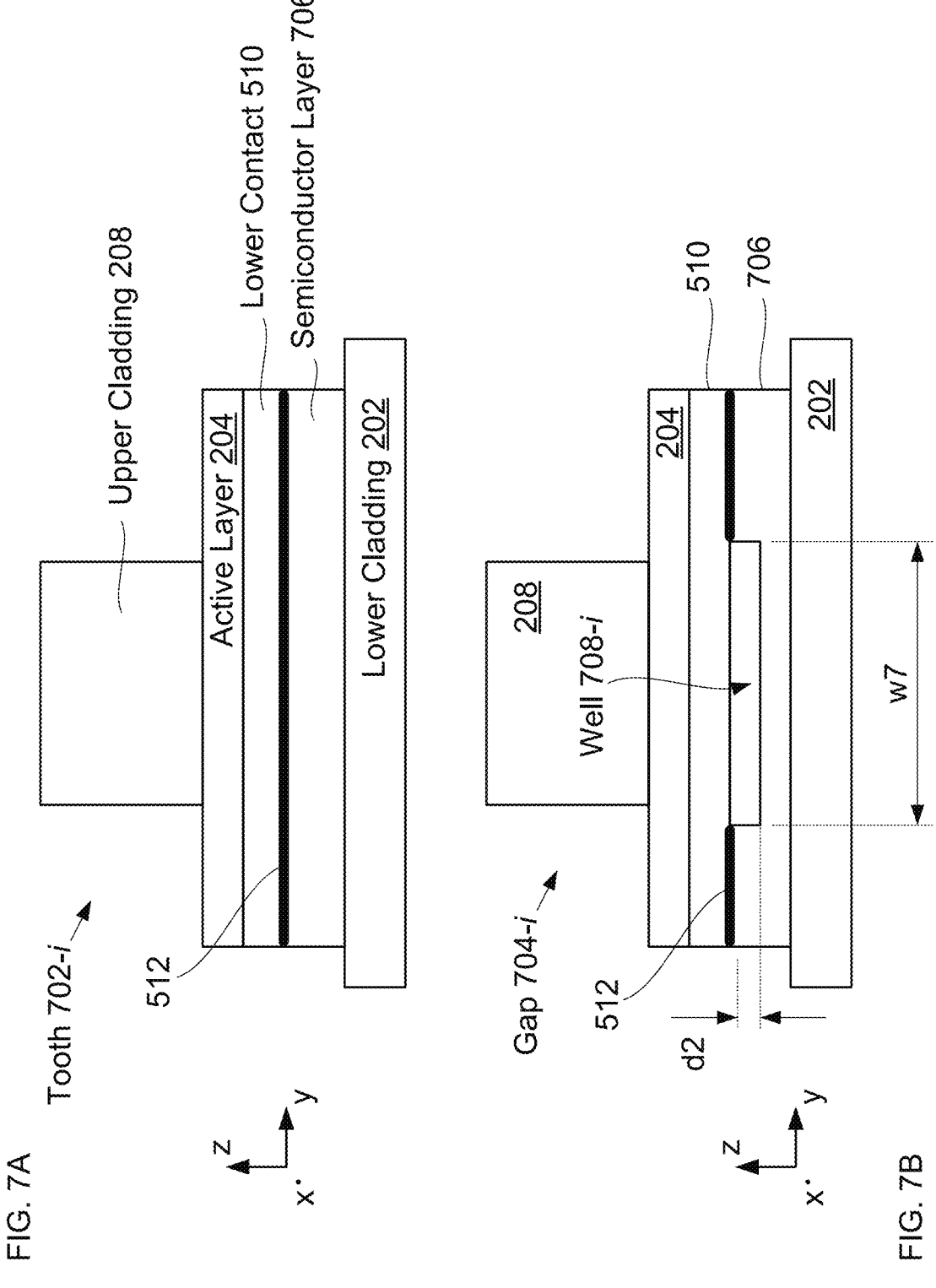

FIG. 7A-B depict schematic drawings of cross-sectional views of a representative tooth and gap, respectively, of yet another alternative DCC laser.

Figures 8A, 8B:
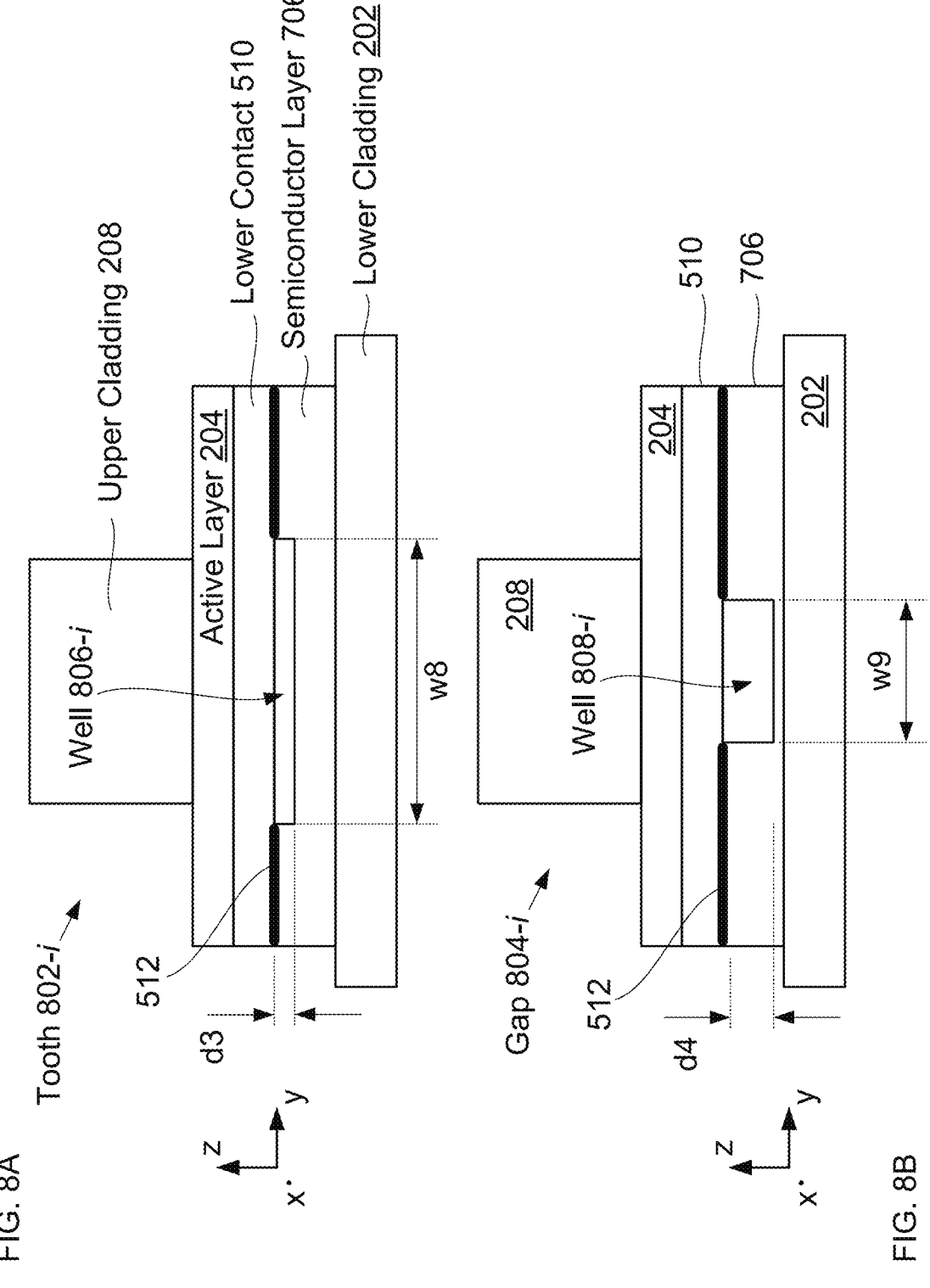

FIG. 8A-B depict schematic drawings of cross-sectional views of a representative tooth and gap, respectively, of yet another alternative DCC laser.

Figure 9:
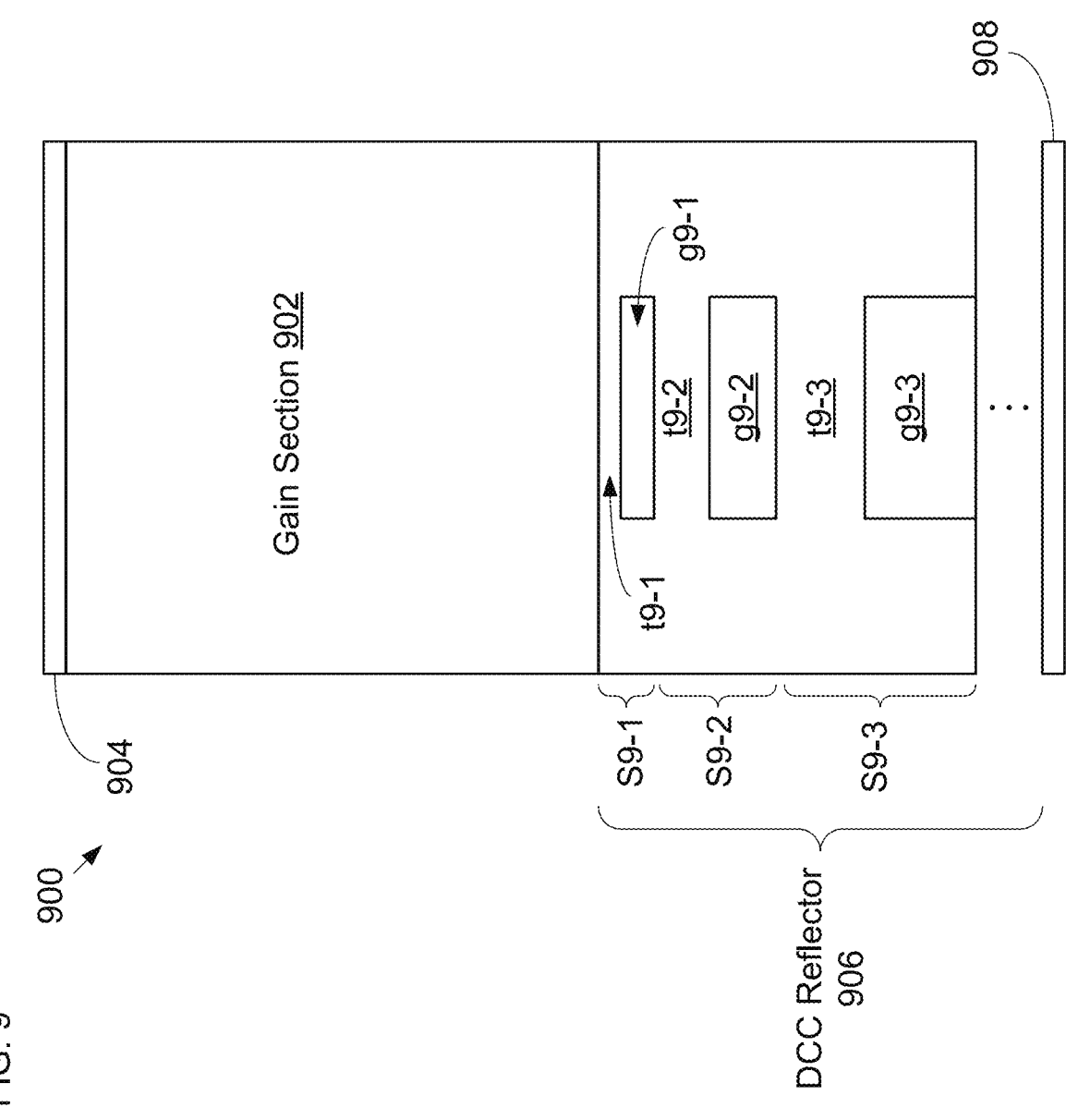

FIG. 9 depicts a schematic drawing of a plan view of another alternative DCC laser in accordance with the present disclosure.

Figure 10:
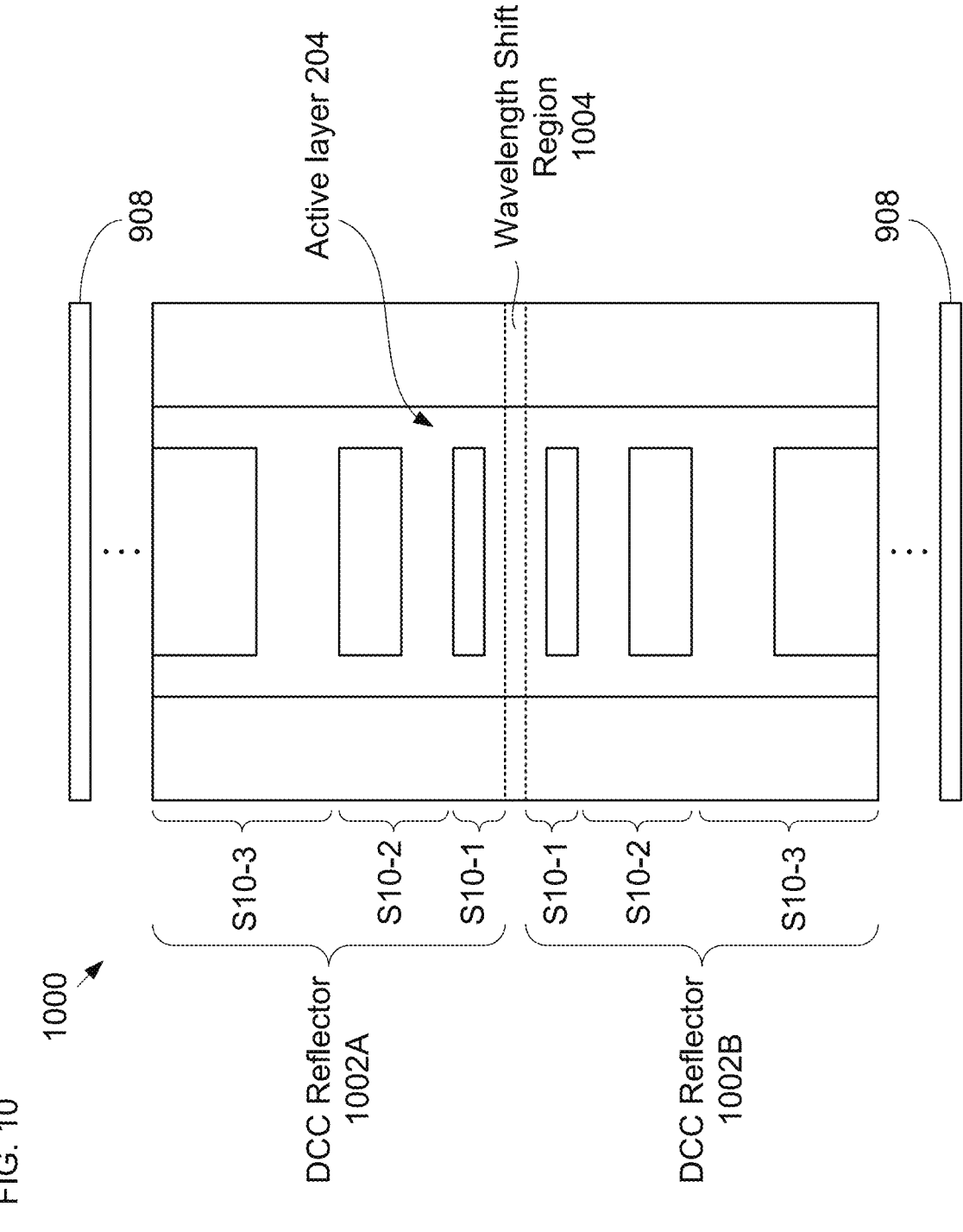

FIG. 10 depicts a schematic drawing of a plan view of yet another alternative DCC laser in accordance with the present disclosure.

DETAILED DESCRIPTION

Figure 1:
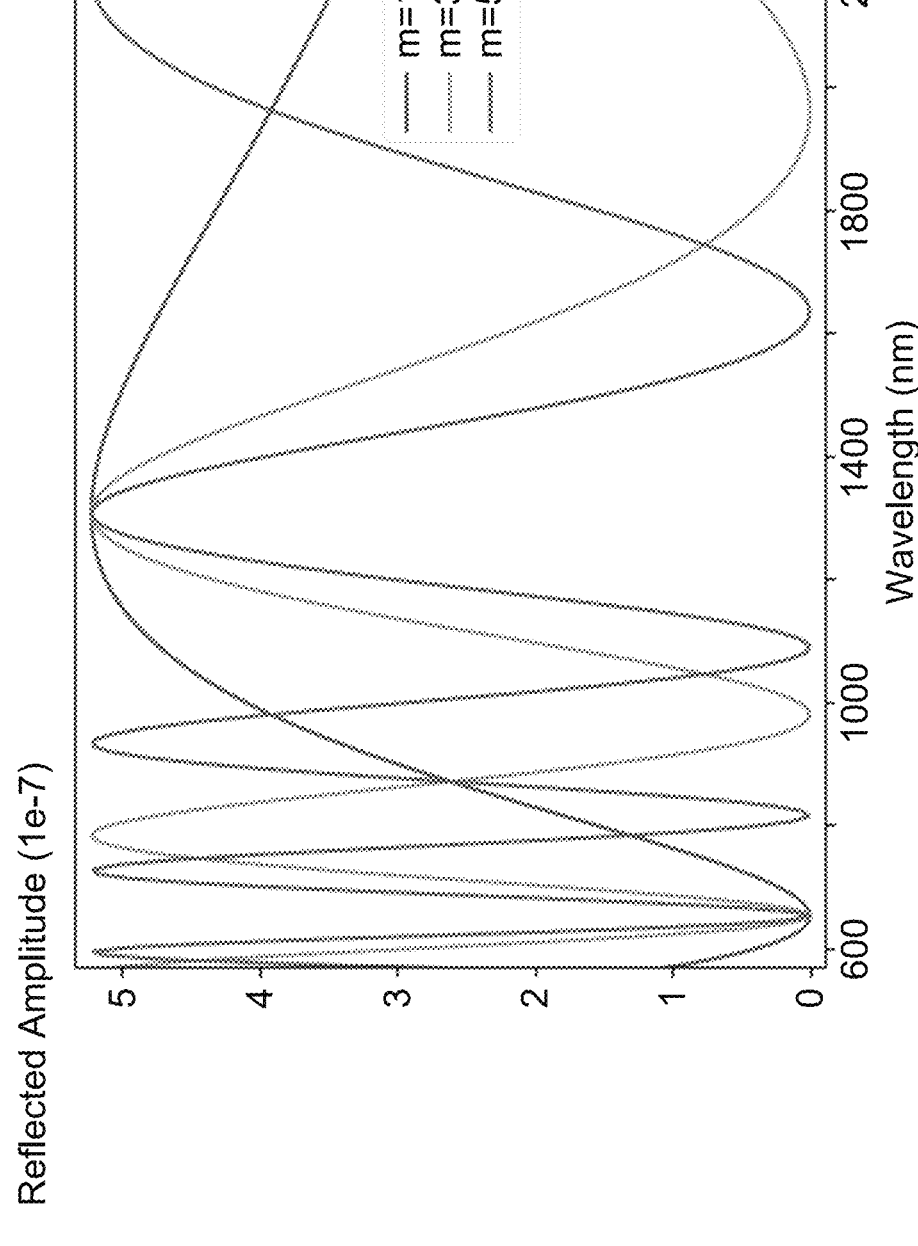
FIG. 1 depicts a plot of reflection spectra of three cavities in an exemplary DCC reflector in accordance with the present disclosure.

FIG. 1 depicts a plot of reflection spectra of three cavities in an exemplary DCC reflector in accordance with the present disclosure. Plot 100 shows that the reflection peaks of three exemplary cavities of a DCC reflector are only aligned at approximately 1300 nm, which represents the operating wavelength, $\lambda_0$, of the cavity.

It should be noted that a plurality of cavities can be designed such that their reflection peaks selectively align at virtually any wavelength desired. Furthermore, the number of segments included in a DCC reflector can be virtually any practical integer, M, without departing from the scope of the present disclosure.

The length, $L_{1,m}$, for m=1 through M, of the tooth of the $m^{th}$ section is given by the formula:

$$L_{1,m}=(\lambda/4n_1+b)(4m+1) \qquad (1)$$

where $n_1$ is the effective refractive index of the tooth, $\lambda$ is the center wavelength of the reflection peak, and b is a section detuning value.

In similar fashion, the length, $L_{2,m}$, of the gap of the $m^{th}$ section is given by the formula:

$$L_{2,m} = \left(\frac{\lambda}{4n_2} - b\right)(4m + 3) \qquad (2)$$

where $n_2$ is the effective refractive index of the gap.

The section detuning value, b, is typically selected to give rise to a phase error that accumulates as a multiple of $\pi/4$. Generally, this value will be based on the center wavelength and the number of segments. In some embodiments, the value of b is determined via a numerical optimization routine.

A DCC reflector in accordance with the present disclosure functions like a DBR, where adding segments increases the reflection strength and narrows the bandwidth. It should be noted that the segment length increases with the total number of segments as well, resulting in a device that is considerably longer than a DBR with equivalent reflection strength. However, in some embodiments, this is an advantage since longer laser devices tend to have lower linewidth and higher output power.

It should be noted that the expressions (4m+1) and (4m+3) in equations (1) and (2) are scaling factors included to reduce radiation loss, as this forces all sections to be at least $\lambda/2$ different in length. This causes scattered light from neighboring sections to be out of phase and interfere fully destructively, thereby eliminating the radiation effect of segments which are higher-order solutions to the Bragg condition.

In some embodiments, a different scaling factor is included in equations (1) and (2). For example, in some embodiments, each of the expressions (4m+1) and (4m+3) is replaced by (2m+1), which increases the density of the reflections thereby enabling fewer required number of segments to obtain a given reflectivity. It should be noted, however, that this substitution also leads to increased propagation loss due to radiation.

As compared to a discrete-mode laser of the prior art, a distributed coupled-cavity laser requires no feature having a dimension that is less than or equal to one-quarter of the operating wavelength, $\lambda_0$, of the laser. In fact, in some cases, the smallest feature of a DCC laser has dimensions that are much larger than $\lambda_0/4$. In some embodiments, a DCC laser does not require reflection from the cleaved facet, thereby enabling higher yield AR/AR lasers for use in PICs or laser arrays, or enabling no facets at all for direct integration with other components.

FIG. 2A depicts a plan view of an illustrative embodiment of a DCC laser in accordance with the present disclosure.

FIGS. 2B-D depict cross-sectional views taken through different points of laser 200.

Laser 200 is a distributed-defect DCC-cavity laser that includes lower cladding 202, active layer 204, reflective-segment (RS) layer 206, upper cladding 208, and end-facet mirrors 210A and 210B, all of which are disposed on a conventional substrate (not shown). Laser 200 can be configured to provide its output signal for myriad applications, such as emitting it into free space, butt coupling it into an optical fiber facet, launching it into a passive surface waveguide as part of a photonic integrated circuit, launching it into an electrically pumped waveguide amplifier, and the like.

Laser 200 is a single-wavelength DCC laser that functions much like a DFB laser. Due to its asymmetric reflection profile, however, both end facets of laser 200 can be anti-reflection (AR) coated and the laser can still produce more power from one side of the device. This represents a significant improvement in efficiency compared to prior-art DFB having two AR-coated facets, while maintaining higher yield and lower cost.

FIG. 3 depicts operations of an exemplary method suitable for forming a DCC laser in accordance with the present disclosure. Method 300 is described with reference to FIGS. 2A-D. Method 300 begins with operation 301, wherein active layer 204 is provided. In the depicted example, the active layer is provided by epitaxially growing it on lower cladding 202; however, in some embodiments, after its formation, active layer 204 is physically connected with another substrate by joining the active layer to the substrate at a bonded interface formed via a bonding technique such as oxygen-plasma-assisted bonding, and the like. In some cases, active layer 204 is physically connected with the other substrate through an intervening layer, such as a contact layer, which is included between the active layer and the other substrate such that the contact layer includes the bonded interface. For the purposes of the present disclosure, including the appended claims, the term "physically connected" is defined as being mechanically joined to. Non-limiting examples of physically connected arrangements include:

i. a layer epitaxially grown on a substrate;
ii. a layer that is bonded to a substrate at a bonded interface;
iii. a first layer disposed on an intermediate layer that is bonded to a substrate (i.e., the first layer, intermediate layer, and substrate are all physically connected).

Lower cladding 202 is a layer of material having a lower refractive index than that of active layer 204 such that the lower cladding serves to at least partially confine light in the active layer within that layer. In the depicted example, lower cladding 202 is a layer of aluminum gallium arsenide (AlGaAs) disposed on a gallium arsenide (GaAs) substrate.

Active layer 204 is a layer of compound semiconductor that includes quantum elements (e.g., quantum dots, quantum dashes, quantum wells, etc.) such that the active layer can provide optical gain. In the depicted example, active layer 204 is a layer of gallium arsenide comprising quantum dots. It should be noted, however, that active layer can include any suitable material and/or any of a wide variety of quantum elements without departing from the scope of the present disclosure. Quantum elements suitable for inclusion in active layer 204 include, without limitation, quantum wells, quantum-well layers, quantum wires, quantum dashes, and the like.

At operation 302, reflective-segment (RS) layer 306 is formed. RS layer 206 is a layer of material suitable for supporting the formation of DCC reflector 212. RS layer 206 is disposed on active layer 204 such that it is optically coupled with active layer 204. In the depicted example, RS layer 204 comprises GaAs; however, a wide range of materials can be used for RS layer 204 without departing from the scope of the present disclosure. In some embodiments, RS layer is not included and DCC reflector 212 is at least partially formed in active layer 204.

At operation 303, DCC reflector 212 is defined.

DCC reflector 212 includes segments S1-1 through S1-M, each of which includes a gap, g, and a tooth, t, (e.g., segment S1-1 includes gap g1 and tooth t1, segment S1-2 includes gap g2 and tooth t2, and so on).

In the depicted example, DCC reflector 212 is formed by etching completely through RS layer 206 in the regions of gaps g1 through gM. As a result, each tooth is a substantially unaltered portion of RS layer 206, while each gap is a region of RS layer 206 that has been completely removed (thereby exposing active layer 204). As discussed below, in some embodiments, RS layer 206 is only partially removed in the regions of gaps g1 through gM.

FIG. 2B depicts a cross-sectional view of laser 200 through line a-a, which is co-linear with axis A1. Segments S2-1 through S2-M are defined in RS layer 206 such that the segments are arranged in series along axis A1 (i.e., the longitudinal axis of laser 200) to collectively define DCC reflector 212, which functions substantially as a reflective waveguide grating. In the depicted example, the value of M is 100; however, one skilled in the art will recognize that any practical value of M is within the scope of the present disclosure.

FIG. 2C depicts a cross-sectional view of laser 200 through line b-b, which runs through tooth t3.

FIG. 2D depicts a cross-sectional view of laser 200 through line c-c, which runs through gap g3. Gap g3 is configured with width w1. It should be noted that the value of width w1 is a matter of design choice and affects the strength of the grating represented by DCC reflector 212.

Length, $L_{1,i}$, of each tooth ti, where i=1 through M, is defined by equation (1) above. In similar fashion, length, $L_{2,i}$, of each gap gi, is defined by equation (2) above.

In the depicted example, the operating wavelength, $\lambda_0$, of laser 200 is 1300 nm, the refractive indices of the teeth and gaps are 3.34 and 3.33, respectively, and the segment detuning value is 1.5 nm. As a result, as given by equations (1) and (2) above, lengths $L_{1,1}$ and $L_{2,1}$ are 494.0 nm and 672.7 nm respectively, lengths $L_{1,2}$ and $L_{2,2}$ are 889.2 nm and 1057.1 nm respectively, lengths $L_{1,3}$ and $L_{2,3}$ are 1284.5 nm and 1441.5 nm respectively, and so on.

Embodiments in accordance with the present disclosure derive significant advantage over the prior art due to the fact that the dimensions of every tooth and gap of a DCC reflector has dimensions that are large enough that it can be lithographically defined and fabricated without the need for expensive lithography approaches, such as E-beam lithography, X-ray lithography, nanoimprinting, etc. This enables narrow-linewidth lasers, spectral filters, and the like, that can be significantly less expensive than prior-art devices.

At operation 304, upper cladding 208 is formed over DCC reflector 212.

Upper cladding 208 is analogous to lower cladding 202 and serves to at least partially confine light in the active layer to that layer. In the depicted example, upper cladding 208 is a layer of aluminum gallium arsenide (AlGaAs) that is regrown over the structure of the DCC reflector after it has been defined in operation 303.

At operation 305, mirrors 210A and 210B are formed. In the depicted example, each of mirrors 210A and 210B is a cleaved facet comprising an anti-reflection coating. Mirrors 210A and 210B are separated by 1800 microns.

It should be noted that, although the refractive-index variation included in the DCC reflector of laser 200 is formed by defining a series of teeth and gaps that extend completely through a RS layer disposed on an active layer, any suitable approach for realizing a refractive-index variation in a suitable layer can be used without departing from the scope of the present disclosure. Some examples of structures that give rise to a variation in effective refractive index along a waveguide are described in U.S. patent application Ser. No. 17/465,403, filed Sep. 2, 2021 and Ser. No. 17/697,199, filed Mar. 17, 2022, each of which is incorporated herein by reference.

Furthermore, although laser 200 is based a GaAs-based material system, the teachings of the present disclosure are applicable to any material system suitable for forming a surface waveguide and/or laser structure. For example, in some embodiments, a DCC reflector is included in a laser that comprises a different III-V material system, a II-VI compound semiconductor system, a single-semiconductor material system, and/or in a passive waveguide based on any suitable material system (e.g., silicon, silicon oxides, silicon nitrides, lithium niobate, etc.).

FIGS. 4A-C depict schematic drawings of plan and cross-sectional views of DCC laser comprising a first alternative embodiment of a DCC reflector in accordance with the present disclosure. DCC laser 400 has a layer structure that includes lower cladding 202, active layer 204 and upper cladding 208.

Active layer 204 is configured to define segments S4-1 through S4-M, which are arranged in series along axis A2 (i.e., the longitudinal axis of laser 400) to collectively define DCC reflector 402. Each segment S4-*i*, where i=1 through M, includes a tooth 404-*i* and a gap 406-*i*. As a result, segments S4-1 through S4-M contain teeth 404-1 through 404-M, which are interleaved with gaps 406-1 through 406-M, where each tooth has width w2, while each gap has width w3. In the depicted example, M=3; however, one skilled in the art will recognize that M can have any practical value without departing from the scope of the present disclosure. Furthermore, teeth 404-1 through 404-M and gaps 406-1 through 406-M are analogous to teeth t1 through tM and gaps g1 through gM, as described above and with respect to FIGS. 2A-D. As a result, the lengths of teeth 404-1 through 404-M and gaps 406-1 through 406-M along axis A2 are dictated by equations (1) and (2) above.

Upper cladding 208 is configured to define a ridge structure disposed on the active layer. In the depicted example, upper cladding 208 and active layer 204 are defined such that they have the same lateral dimensions.

The difference in widths w2 and w3 determines the reflection strength of the cavity structure defined by teeth 404-1 through 404-M and gaps 406-1 through 406-M.

As discussed below, in some embodiments, DCC reflector is optically coupled with another waveguide disposed below it.

Active layer 204 is configured to define segments S4-1 through S4-M, which are arranged in series along axis A2 (i.e., the longitudinal axis of laser 400) to collectively define DCC reflector 402. Each segment S4-*i*, where i=1 through M, includes a tooth 404-*i* and a gap 406-*i*. As a result, segments S4-1 through S4-M contain teeth 404-1 through 404-M, which are interleaved with gaps 406-1 through 406-M, where each tooth has width w2, while each gap has width w3. In the depicted example, M=3; however, one skilled in the art will recognize that M can have any practical value without departing from the scope of the present disclosure. Furthermore, teeth 404-1 through 404-M and gaps 406-1 through 406-M are analogous to teeth t1 through tM and gaps g1 through gM, as described above and with respect to FIGS. 2A-D. As a result, the lengths of teeth 404-1 through 404-M and gaps 406-1 through 406-M along axis A2 are dictated by equations (1) and (2) above.

FIG. 5A depicts a schematic drawing of plan view of a portion of a second alternative DCC laser in accordance with the present disclosure. DCC laser 500 includes DCC reflector 502, which includes segments S5-1 through S5-M, which are arranged in series along axis A3 (i.e., the longitudinal axis of laser 500). Each segment S5-*i*, where i=1 through M, includes tooth 504-*i* and gap 506-*i*. Segments S5-1 through S5-M are arranged along the longitudinal direction of the laser to collectively define a reflective coupled-cavity structure. DCC laser 500 has a layer structure that includes lower cladding 202, waveguide 508, lower contact 510, active layer 204, and upper cladding 208.

FIGS. 5B-C depict schematic drawings of cross-sectional views of a representative tooth and gap, respectively, of DCC laser 500. Tooth 504-*i*, where i=1 through M, and gap 506-*i* are analogous to tooth ti and gap gi as described above; however, they are formed in waveguide 508 to collectively give rise to a reflective structure that is optically coupled with active layer 204.

Waveguide 508 is a surface waveguide core formed on lower cladding 202. In the depicted example, waveguide 508 has a width and thickness that enables single-mode operation. In some embodiments, waveguide 508 is configured for multi-mode operation. In the depicted example, waveguide 508 comprises silicon and lower cladding 202 is silicon dioxide; however, waveguide 508 and lower cladding 202 can include any suitable waveguide structure or material.

Lower contact 510 is an electrically conductive layer disposed between waveguide 508 and active layer 204. Lower contact 510 also acts as a bonding layer that enables the upper structure of DCC laser 500 to be physically connected with a fully formed waveguide 508 at bonded interface 512. In the depicted example, bonded interface 512 is formed using oxygen-plasma-assisted bonding; however, myriad bonding methods can be used to join waveguide 508 and lower contact 510 such that they are physically connected without departing from the scope of the present disclosure.

Each tooth 504-*i*, where i=1 through M, has width w4 and length $L_{1,i}$, as dictated by equation (1) above.

In similar fashion, each gap 506-*i* has width w5 and length $L_{2,i}$, as dictated by equation (2) above.

The reflection strength of the coupled cavity formed by teeth 504-1 through 504-M and gaps 506-1 through 506-M is determined by widths w4 and w5.

In some embodiments, DCC laser 500 is formed by defining waveguide 508 and lower cladding 202 on a first substrate, forming lower contact, active region, and upper cladding 208 on a second substrate, joining active region 206 and waveguide 508 via lower contact 510, and removing the second substrate.

In some embodiments, all of the layers of DCC laser 500 are formed on the same substrate via epitaxial and/or heteroepitaxial growth and gaps 506-1 through 506-M are formed by laterally etching the waveguide material from the sides.

FIGS. 6A-B depict schematic drawings of cross-sectional views of a representative tooth and gap, respectively, of DCC laser 600. Tooth 602-*i*, where i=1 through M, and gap 604-*i* are analogous to tooth ti and gap gi as described above; however, their salient features are formed in waveguide 506 to collectively give rise to a reflective grating, thereby defining a DCC reflector.

DCC laser 600 is analogous to DCC laser 500; however, in DCC laser 600, a change in effective refractive index at each gap is induced by forming a structural feature (i.e., a well 606-*i*) within waveguide 508 rather than changing its width.

In each of gaps 604-1 through 604-M, a corresponding well 606 is formed by etching partially into the thickness of waveguide 508 to etch depth d1 to provide a desired refractive index for the material of the gap. The width of each well 606-*i* is w6, which is smaller than w4, while the length of each of wells 606-*i* is dictated by equations (1) and (2) above. The reflection strength of the coupled cavity defined by teeth 602-1 through 602-M and gaps 604-1 through 604-M is dictated by d1 and w6 and can be changed by changing one or both of these dimensions.

In some embodiments, structural features are formed in a substantially full-surface semiconductor layer, such as silicon, that is disposed between lower cladding 202 and lower contact 510.

FIG. 7A-B depict schematic drawings of cross-sectional views of a representative tooth and gap, respectively, of yet another alternative DCC laser. DCC laser 700 comprises a DCC reflector that includes teeth 702-*i*, where i=1 through M, and gaps 704-*i*, which arranged the longitudinal direction of the laser to collectively define a reflective grating structure. DCC laser 700 has a layer structure that includes lower cladding 202, semiconductor layer 706, lower contact 510, active layer 204, and upper cladding 208.

Tooth 702-*i*, where i=1 through M, and gap 704-*i* are analogous to tooth ti and gap gi as described above; however, their salient features are formed in semiconductor layer 706 to collectively give rise to a reflective grating.

Semiconductor layer 706 is a slab waveguide formed of a layer of semiconductor suitable for optically coupling with active layer 204 via lower contact 510, which is physically connected to semiconductor layer 706 via bonded interface 512. In the depicted example, semiconductor layer 706 is a layer of silicon and lower cladding 202 is silicon dioxide; however, any suitable semiconductor and cladding material can be used without departing from the scope of the present disclosure.

In each of gaps 704-1 through 704-M, a well 708 is formed by etching partially into the thickness of waveguide 706 to etch depth d2 to provide a desired refractive index for the material of the gap. The width of each well 706-*i* is w7, while the length of each of wells 708-*i* is dictated by equations (1) and (2) above. The reflection strength of the coupled cavity defined by teeth 702-1 through 702-M and gaps 704-1 through 704-M is dictated by d2 and w7 and can be changed by changing one or both of these dimensions.

FIG. 8A-B depict schematic drawings of cross-sectional views of a representative tooth and gap, respectively, of yet another alternative DCC laser. DCC laser 800 comprises a DCC reflector that includes teeth 802-*i*, where i=1 through M, and gaps 804-*i*, which arranged the longitudinal direction of the reflector to collectively define a reflective grating structure. DCC laser 800 has a layer structure that includes lower cladding 202, semiconductor layer 706, lower contact 510, active layer 204, and upper cladding 208.

Tooth 802-*i*, where i=1 through M, and gap 804-*i* are analogous to tooth ti and gap gi as described above; however, each includes a structural feature formed in semiconductor layer 706 to collectively give rise to a reflective grating.

In each of teeth 802-1 through 802-M, a well 806 is formed by etching partially into the thickness of waveguide 606 to etch depth d3 to provide a desired refractive index for the material of the tooth. The width of each well 806-*i* is w8, while the length of each of wells 806-*i* is dictated by equation (1) above.

In each of gaps 804-1 through 804-M, a well 808 is formed by etching partially into the thickness of waveguide 808 to etch depth d4 to provide a desired refractive index for the material of the gap. The width of each well 808-*i* is w9, while the length of each of wells 808-*i* is dictated by equation (2) above. In some embodiments, d3 and d4 are the same depth.

The reflection strength of the coupled cavity defined by teeth 802-1 through 802-M and gaps 804-1 through 804-M is dictated by d3, d4, w8, and w9 and can be changed by changing one or more of these dimensions.

It should be noted that DCC reflectors constructed in accordance with the present disclosure can used in a manner analogous to a DBR, for example, by locating it at the output of a gain section of a laser. In this configuration the active layer shown in preceding drawings and discussions does not need to be present, though it can be if desired. Alternatively, they can be used analogously to a DFB laser, where two DCC reflectors are placed back to back with an odd multiple of a λ/4 phase shift in the center.

Still further, since there are two separate sets of cavities (defined by Equation (1) and (2) respectively), it is possible to detune these cavities slightly, creating a defect in the center of the reflection stop-band (as represented by the b parameter in Equations (1) and (2)).

FIG. 9 depicts a schematic drawing of a plan view of another alternative DCC laser in accordance with the present disclosure. Laser 900 is a DCC laser comprising a laser cavity defined by a gain section that is located between a cleaved facet mirror and a passive DBR mirror comprising a DCC reflector. Laser 900 includes gain section 902, conventional facet mirror 904, and DCC reflector 906.

Gain section 902 is a conventional gain section suitable for use in a waveguide-based laser cavity.

Facet mirror 904 is a conventional cleaved facet on which a high-reflectivity coating is disposed.

DCC reflector 906 is a section of waveguide comprising a series of 100 segments S9-1 through S9-100, which are analogous to segments S1-1 through S1-M described above and with respect to FIGS. 2A-D; however, DCC reflector 906 does not include gain material. As a result, DCC reflector 906 is a passive reflector that simply functions as one cavity mirror for the laser cavity of laser 900.

It should be noted that only the first 3 segments of DCC reflector 906 are shown in FIG. 8. Furthermore, although DCC reflector 906 includes 100 segments, some embodiments include a different number of segments. As will be apparent to one skilled in the art, after reading this Specification, increasing the number of segments included in a DCC mirror enables more wavelength selectivity.

As noted above, each segment S9-$i$, where i=1 through 100, includes one tooth t9-$i$ and one gap g9-$i$, the lengths of which (i.e., $L_{1,i}$ and $L_{2,i}$, respectively) are dictated according to equations (1) and (2), respectively. In the depicted example, the operating wavelength, $\lambda_0$, is 1300 nm, the refractive indices of the teeth and gaps are 3.34 and 3.33, respectively, and the segment detuning value is 0 nm. As a result, lengths $L_{1,1}$ and $L_{2,1}$ are 487 nm and 683 nm respectively, lengths $L_{1,2}$ and $L_{2,2}$ are 876 nm and 1074 nm respectively, lengths $L_{1,3}$ and $L_{2,3}$ are 1265 nm and 1464 nm respectively, and so on.

DCC reflector 906 terminates at segment S9-100, at which facet 908 is located.

Because DCC reflector 906 functions as a cavity mirror, facet 908 is typically coated with an anti-reflection coating.

FIG. 10 depicts a schematic drawing of a plan view of yet another alternative DCC laser in accordance with the present disclosure. Laser 1000 is a DFB-style laser comprising a laser cavity defined by a gain section that is extends between two active DCC mirrors, each comprising a DCC reflector. The layer structure of laser 1000 is analogous to that of laser 200.

Laser 1000 includes active layer 204, DCC reflectors 1002A and 1002B, wavelength shift region 1004, and end facets 908.

Active layer 204 is configured such that it is present throughout the entire cavity length between end facets 908.

Each of DCC reflectors 1002A and 1002B is a wavelength-selective DCC reflector having 100 segments. Each of DCC reflectors 1002A and 1002B is analogous to DCC reflector 212, described above and with respect to FIGS. 2A-D. However, DCC reflectors 1002A and 1002B are arranged in a back-to-back arrangement and separated by wavelength shift region 1004.

In the depicted example, wavelength shift region 1004 has a length equal to one-quarter of the operating wavelength, $\lambda_0$, of laser 1000. In some embodiments, wavelength shift region 1004 has a length equal to a different odd multiple of one-quarter of $\lambda_0$ (e.g., $3\lambda_0/4$, $5\lambda_0/4$, etc.).

As noted above, each segment S10-$i$, where i=1 through 100, includes one tooth t10-$i$ and one gap g10-$i$, the lengths of which (i.e., $L_{1,i}$ and $L_{2,i}$, respectively) are dictated according to equations (1) and (2), respectively. In the depicted example, the operating wavelength, $\lambda_0$, is 1300 nm, the refractive indices of the teeth and gaps are 3.34 and 3.33, respectively, and the segment detuning value is 0 nm. As a result, lengths $L_{1,1}$ and $L_{2,1}$ are approximately 487 nm and 683 nm respectively, lengths $L_{1,2}$ and $L_{2,2}$ are approximately 876 nm and 1074 nm respectively, lengths $L_{1,3}$ and $L_{2,3}$ are approximately 1265 nm and 1464 nm respectively, and so on.

It is to be understood that the disclosure teaches just some examples of embodiments and that many variations of the invention can easily be devised by those skilled in the art after reading this disclosure and that the scope of the present invention is to be determined by the following claims.

What is claimed is:

1. An article comprising:
a substrate; and
a first distributed coupled-cavity (DCC) reflector disposed on the substrate, the first DCC reflector having a first longitudinal axis and being reflective at a first wavelength, wherein the first DCC reflector includes:
a first plurality of teeth, wherein the teeth of the first plurality thereof have different lengths along the first longitudinal axis, and wherein each tooth of the first plurality thereof has a first length that is based on its location along the first longitudinal axis; and
a first plurality of gaps, wherein the gaps of the first plurality thereof have different lengths along the first longitudinal axis, and wherein each gap of the first plurality thereof has a second length that is based on its location along the first longitudinal axis;
wherein the of teeth of the first plurality thereof and the gaps of the first plurality thereof are interleaved and collectively define a first plurality of cavities, each cavity of the first plurality thereof having a reflection peak at the first wavelength.

2. The article of claim 1 wherein the first DCC reflector is configured as a mirror of a laser cavity.

3. The article of claim 2 further comprising a reflective-segment (RS) layer and an active layer for providing optical gain, wherein the RS layer includes the first DCC reflector, and wherein the active layer and RS layer are optically coupled.

4. The article of claim 1 further comprising:
an active layer for providing optical gain, wherein the active layer includes the first plurality of teeth and the first plurality of gaps; and
a cladding layer that is disposed on the active layer, wherein the cladding layer includes a second plurality of teeth and a second plurality of gaps;
wherein the second plurality of teeth substantially matches the first plurality of teeth and the second plurality of gaps substantially matches the first plurality of gaps; and
wherein the first DCC reflector further comprises the second plurality of teeth and the second plurality of gaps.

5. The article of claim 1 further comprising an active layer for providing optical gain, wherein the active layer is optically coupled with the first DCC reflector, and wherein the cavities of the first plurality thereof are detuned such that they are characterized by a phase error that accumulates as a multiple of p/4.

6. The article of claim 5 wherein the active layer includes the first DCC reflector.

7. The article of claim 1 further comprising:

a second DCC reflector disposed on the substrate, the second DCC reflector having a second longitudinal axis and being reflective at the first wavelength, wherein the second DCC reflector includes:

a second plurality of teeth, wherein the teeth of the second plurality thereof have different lengths along the second longitudinal axis, and wherein each tooth of the second plurality thereof has a third length that is based on its location along the second longitudinal axis; and a second plurality of gaps, wherein the gaps of the second plurality thereof have different lengths along the second longitudinal axis, and wherein each gap of the second plurality thereof has a fourth length that is based on its location along the second longitudinal axis;

wherein the of teeth of the second plurality thereof and the gaps of the second plurality thereof are interleaved and collectively define a second plurality of cavities, each cavity of the second plurality thereof having a reflection peak at the first wavelength; and a gain section;

wherein the gain section, the first DCC reflector, and second DCC reflector collectively define a laser cavity of a laser.

8. The article of claim 1 further comprising a waveguide disposed on the substrate, wherein the waveguide includes the first DCC reflector.

9. The article of claim 8 further comprising an active layer for providing optical gain, the active layer being optically coupled with the waveguide.

10. The article of claim 9 further comprising a bonded interface, wherein the active layer and the waveguide are physically connected via the bonded interface.

11. The article of claim 10 further comprising a first layer that is between the active layer and the waveguide, wherein the first layer and the waveguide are joined at the bonded interface.

12. The article of claim 8 further comprising a semiconductor layer that includes the waveguide.

13. An article comprising a first distributed coupled-cavity (DCC) reflector disposed on a substrate, the first DCC reflector having a first longitudinal axis and being reflective at a first wavelength, $l_o$, wherein the first DCC reflector includes a first plurality of segments, the first plurality of segments including M segments that are arranged contiguously along the first longitudinal axis, and wherein each $m^{th}$ segment, where m=1 through M, includes:

a first tooth having a first length, $L_{1,m}$, along the first longitudinal axis, wherein $L_{1,m}=(l_o/4n_1+b)$ (4m+1); and a first gap having a second length, $L_{2,m}$, along the first longitudinal axis, wherein $L_{2,m}=(l_o/4n_2-b)$ (4m+3);

wherein $n_1$ is the effective refractive index of the first tooth, $n_2$ is the effective refractive index of the first gap, and b is a section-detuning value for giving rise to a phase error that accumulates as a multiple of p/4;

wherein the first plurality of segments defines a first plurality of cavities, each cavity of the first plurality thereof having a reflection peak at the first wavelength.

14. The article of claim 13 wherein the first DCC reflector is configured as a mirror of a laser cavity.

15. The article of claim 14 further comprising a reflective-segment (RS) layer and an active layer for providing optical gain, wherein the RS layer includes the first DCC reflector, and wherein the active layer and RS layer are optically coupled.

16. The article of claim 13 further comprising an active layer for providing optical gain, wherein the active layer includes the first DCC reflector.

17. The article of claim 13 further comprising:

an active layer for providing optical gain; and a cladding layer that is disposed on the active layer;

wherein the DCC reflector resides in both the active layer and the cladding layer such that each segment of the plurality thereof includes a portion of the active layer and a portion of the cladding layer.

18. The article of claim 13 further comprising:

a second DCC reflector disposed on the substrate, the second DCC reflector having a second longitudinal axis and being reflective at the first wavelength, wherein the second DCC reflector includes a second plurality of segments, the second plurality of segments including N segments that are arranged contiguously along the second longitudinal axis, and wherein each $n^{th}$ segment, where n=1 through N, includes:

a second tooth having a third length, $L_{3,n}$, along the second longitudinal axis, wherein $L_{3,n}=(l_o/4n_3+b)$ (4n+1); and a second gap having a fourth length, $L_{4,n}$, along the second longitudinal axis, wherein $L_{4,n}=(l_o/4n_4-b)$ (4n+3);

wherein $n_3$ is the effective refractive index of the tooth and $n_4$ is the effective refractive index of the gap;

wherein the second plurality of segments defines a second plurality of cavities, each cavity of the second plurality thereof having a reflection peak at the first wavelength;

a gain section;

wherein the gain section, the first DCC reflector, and second DCC reflector collectively define a laser cavity of a laser.

19. The article of claim 13 further comprising a waveguide disposed on the substrate, wherein the waveguide includes the first DCC reflector.

20. The article of claim 19 further comprising an active layer for providing optical gain, the active layer being optically coupled with the waveguide.

21. The article of claim 20 further comprising a bonded interface, wherein the active layer and the waveguide are physically connected via the bonded interface.

22. The article of claim 21 further comprising a first layer that is between the active layer and the waveguide, wherein the first layer and the waveguide are joined at the bonded interface.

23. The article of claim 19 further comprising a semiconductor layer that includes the waveguide.

24. A method comprising:

providing a first substrate; and forming a first distributed coupled-cavity (DCC) reflector on the first substrate, the first DCC reflector being formed such that it has a first longitudinal axis, is reflective at a first wavelength, $l_o$, and includes:

a first plurality of teeth, wherein the teeth of the first plurality thereof have different lengths along the first longitudinal axis, and wherein each tooth of the first plurality thereof has a first length that is based on its location along the first longitudinal axis; and a first plurality of gaps, wherein the gaps of the first plurality thereof have different lengths along the first longitudinal axis, and wherein each gap of the first plurality thereof has a second length that is based on its location along the first longitudinal axis;

wherein the of teeth of the first plurality thereof and the gaps of the first plurality thereof are interleaved and collectively define a first plurality of cavities, each cavity of the first plurality thereof having a reflection peak at the first wavelength.

25. The method of claim 24 wherein the first DCC reflector is formed such that it includes a first plurality of M segments that are arranged contiguously along the first longitudinal axis, and wherein each $m^{th}$ segment, where m=1 through M, includes:

an $m^{th}$ tooth of the first plurality of teeth, the $m^{th}$ tooth having a first length, $L_{1,m}$, along the first longitudinal axis, wherein $L_{1,m}=(l_o/4n_1+b)$ (4m+1); and an $m^{th}$ gap of the first plurality of gaps, the $m^{th}$ gap having a second length, $L_{2,m}$, along the first longitudinal axis, wherein $L_{2,m}=(l_o/4n_2-b)$ (4m+3);

wherein $n_1$ is the effective refractive index of the first tooth, $n_2$ is the effective refractive index of the first gap, and b is a section-detuning value for giving rise to a phase error that accumulates as a multiple of p/4.

26. The method of claim 24 further comprising forming a laser cavity having a first cavity mirror that includes the first DCC reflector.

27. The method of claim 26 further comprising:

providing the first substrate such that it includes an active layer for providing optical gain; and forming a reflective-segment (RS) layer on the active layer;

wherein the first DCC reflector in the RS layer; and wherein the first DCC reflector and the active layer are optically coupled.

28. The method of claim 24 further comprising:

providing an active layer for providing optical gain on the first substrate; and providing a cladding layer that is disposed on the active layer;

wherein the first DCC reflector is formed such that each of the first plurality of teeth and each of the first plurality of gaps includes a portion of the active layer and a portion of the cladding layer.

29. The method of claim 24 further comprising:

providing a gain section disposed on the first substrate; and forming a second DCC reflector disposed on the first substrate, the second DCC reflector being formed such that it has a second longitudinal axis, is reflective at the first wavelength, and includes:

a second plurality of teeth, wherein the teeth of the second plurality thereof have different lengths along the second longitudinal axis, and wherein each tooth of the second plurality thereof has a third length that is based on its location along the second longitudinal axis; and a second plurality of gaps, wherein the gaps of the second plurality thereof have different lengths along the second longitudinal axis, and wherein each gap of the second plurality thereof has a fourth length that is based on its location along the second longitudinal axis;

wherein the of teeth of the second plurality thereof and the gaps of the second plurality thereof are interleaved and collectively define a second plurality of cavities, each cavity of the second plurality thereof having a reflection peak at the first wavelength; and wherein the gain section, the first DCC reflector, and second DCC reflector are configured such that they collectively define a laser cavity of a laser.

30. The method of claim 24 further comprising providing a waveguide disposed on the first substrate, wherein the waveguide includes the first DCC reflector.

31. The method of claim 30 further comprising providing an active layer for providing optical gain, the active layer being optically coupled with the waveguide.

32. The method of claim 31 further comprising:

providing the active layer such that it is disposed on a second substrate; and forming a bonded interface that physically connects the active layer and the waveguide such that they are optically coupled.

33. The method of claim 32 further comprising providing a first layer that is disposed on the second substrate, wherein the active layer and first layer are arranged such that the first layer is between the active layer and the waveguide when they are physically connected, and wherein the first layer and the waveguide are joined at the bonded interface.

34. The method of claim 24 further comprising providing a semiconductor layer that includes the waveguide.

35. The method of claim 24 further comprising:

growing an active layer for providing optical gain on the first substrate; and forming a reflective-segment (RS) layer on the active layer such that the RS layer and the active layer are optically coupled;

wherein the first DCC reflector is formed by etching at least partially into the RS layer to define the first plurality of gaps.

36. The method of claim 24 further comprising:

growing an active layer for providing optical gain on the first substrate; and forming a cladding that is disposed on the active layer;

wherein the first DCC reflector is formed by removing portions of each of the active layer and cladding to define the first plurality of gaps.

*    *    *    *    *